United States Patent [19]

Or-Bach et al.

[11] Patent Number: 4,827,325
[45] Date of Patent: May 2, 1989

[54] PROTECTIVE OPTICAL COATING AND METHOD FOR USE THEREOF

[76] Inventors: Zvi Or-Bach, 143 A Derech Hayam, Haifa, Israel; Joseph Salzman, 1715 Ellincourt Dr., South Pasadena, Calif. 91030

[21] Appl. No.: 46,523

[22] Filed: May 4, 1987

[30] Foreign Application Priority Data

May 8, 1986 [IL] Israel ........................................ 78730

[51] Int. Cl.[4] ...................... H01L 27/02; H01L 29/34
[52] U.S. Cl. .......................................... 357/54; 357/51
[58] Field of Search ..................... 357/51, 54; 437/241, 437/243, 922

[56] References Cited

U.S. PATENT DOCUMENTS

| | | |
|---|---|---|
| 3,740,523 | 6/1973 | Cohen et al. |
| 4,238,839 | 12/1980 | Redfern et al. |
| 4,387,503 | 6/1987 | Aswell et al. |
| 4,692,786 | 9/1987 | Lidenfelser ........................... 357/54 |

OTHER PUBLICATIONS

J. C. North et al., "Laser Coding of Bipolar Read-Only Memories", *IEEE Journal of Solid-State Circuits*, vol. SC-11, No. 4 (Aug. 1976) pp. 500-505.

Smart, D. "Optimization of Semiconductor Layer Thickness for Repair of RAMs", application report 150, Teradyne Inc., Boston, MA.

North, J. C., "Laser Vaporization of Metal Films-Effect of Optical Interference in Underlying Dielectric Layers", *Journal of Applied Physics*, vol. 48, No. 6 (Jun. 1977) pp. 2419-2423.

*Primary Examiner*—J. Carroll
*Attorney, Agent, or Firm*—Ladas & Parry

[57] ABSTRACT

A multilayer optical coating for semiconductor substrates characterized in that it is etchable by conventional techniques used for fabrication of integrated circuits and has high reflectivity.

11 Claims, 2 Drawing Sheets

PROTECTIVE OPTICAL COATING AND METHOD FOR USE THEREOF

FIELD OF THE INVENTION

The present invention relates to electronic circuitry generally and more particularly to the manufacture of integrated circuits.

BACKGROUND OF THE INVENTION

There exist various techniques for manufacture of integrated circuits using laser radiation to fuse conductive links. Examples of such techniques appear in U.S. Pat. No. 4,387,503 to Aswell et al, U.S. Pat. No. 4,238,839 to Redfern et al, and U.S. Pat. No. 3,740,523 to Cohen et al.

There is described in applicant's pending Israel Patent Application No. 74108, filed Jan. 20, 1985, semiconductor devices including a collection of semiconductor elements and having fusible links interconnecting the collection of semiconductor elements, whereby selective fusing of the fusible links, as by a laser, defines the electronic function provided by the collection of semiconductor elements.

Laser etching of the type envisioned in the above mentioned examples must be highly specific and must enable etching of a conductor on a given layer without damaging the substrate or underlying conductors in different layers of the semiconductor device.

This requirement has been approached by optimization of dielectric layer thicknesses. Such optimization is described in Application Report 150 entitled "Optimization of Semiconductor Layer Thicknesses for Repair of RAMs" by Don Smart of Teradyne Inc. of Boston, Mass., U.S.A.

A detailed study of the optical interference in dielectric layers which separate metal films appears in "Laser vaporization of metal films-Effect of optical interference in underlying dielectric layers" by J. C. North, *Journal of Applied Physics*, Vol. 48, No. 6, June 1977, pages 2419–2423.

Silicon nitride has been used in connection with microelectronic fabrication for insulation and surface protection. It has not heretofore been identified for use in optical coating.

SUMMARY OF THE INVENTION

The present invention seeks to provide an etchable dielectric coating for substrates on which are formed semi-conductor devices to enable precise high density laser trimming and fusing functions.

There is thus provided in accordance with a preferred embodiment of the invention, a multilayer optical coating for semiconductor substrates characterized in that it is etchable by conventional techniques used for fabrication of integrated circuits and has high reflectivity.

Additionally in accordance with an embodiment of the invention, the optical coating is further characterized in that it has substantially zero phase shift characteristics for the reflected field, enhancing the fusing function.

In accordance with a preferred embodiment of the invention, the multilayer coating produces high reflectivity in the range of 0.7 or higher for a wavelength centered at 500 nanometers.

Further in accordance with a preferred embodiment of the present invention, the optical coating is further characterized in that it comprises silicon nitride, $Si_3N_4$.

Additionally in accordance with a preferred embodiment of the present invention, the multilayer coating comprises alternating layers of silicon dioxide $SiO_2$ and $Si_3N_4$.

In accordance with a preferred embodiment of the invention, the multilayer coating comprises the following layers:

| Layer | Material |
|---|---|
| 1. | $SiO_2$ |
| 2. | $Si_3N_4$ |
| 3. | $SiO_2$ |
| 4. | $Si_3N_4$ |
| 5. | $SiO_2$ |
| 6. | $Si_3N_4$ |
| 7. | $SiO_2$ |
| 8. | $Si_3N_4$ |
| 9. | $SiO_2$ | where the lowest numbered layer is closest to the substrate.

Additionally in accordance with an embodiment of the present invention the thicknesses of the respective layers are as follows:

| Layer | Material | Thickness (microns) |
|---|---|---|
| 1. | $SiO_2$ | 0.08446 |
| 2. | $Si_3N_4$ | 0.06250 |
| 3. | $SiO_2$ | 0.08446 |
| 4. | $Si_3N_4$ | 0.06250 |
| 5. | $SiO_2$ | 0.08446 |
| 6. | $Si_3N_4$ | 0.06250 |
| 7. | $SiO_2$ | 0.08446 |
| 8. | $Si_3N_4$ | 0.06250 |
| 9. | $SiO_2$ | 0.25338 | where the lowest numbered layer is closest to the substrate.

Further in accordance with an embodiment of the invention, the multilayer coating may be applied at predetermined windows, distributed as desired on a substrate.

Additionally in accordance with an embodiment of the invention, there is provided a semiconductor device employing a multilayer coating according to the invention.

Further in accordance with an embodiment of the invention, there is provided a method for producing a semiconductor device employing a multilayer coating according to the invention.

BRIEF DESCRIPTION OF A PREFERRED EMBODIMENT

The present invention will be understood and appreciated more fully from the following detailed description taken in conjunction with the drawings in which:

FIG. 1 is a cross sectional illustration of a semiconductor device having the coating of the present invention formed thereon; and FIG. 2 is a cross sectional illustration of a semiconductor device having the coating of the present invention formed at selected areas thereon.

DETAILED DESCRIPTION OF THE INVENTION

Figure 1:
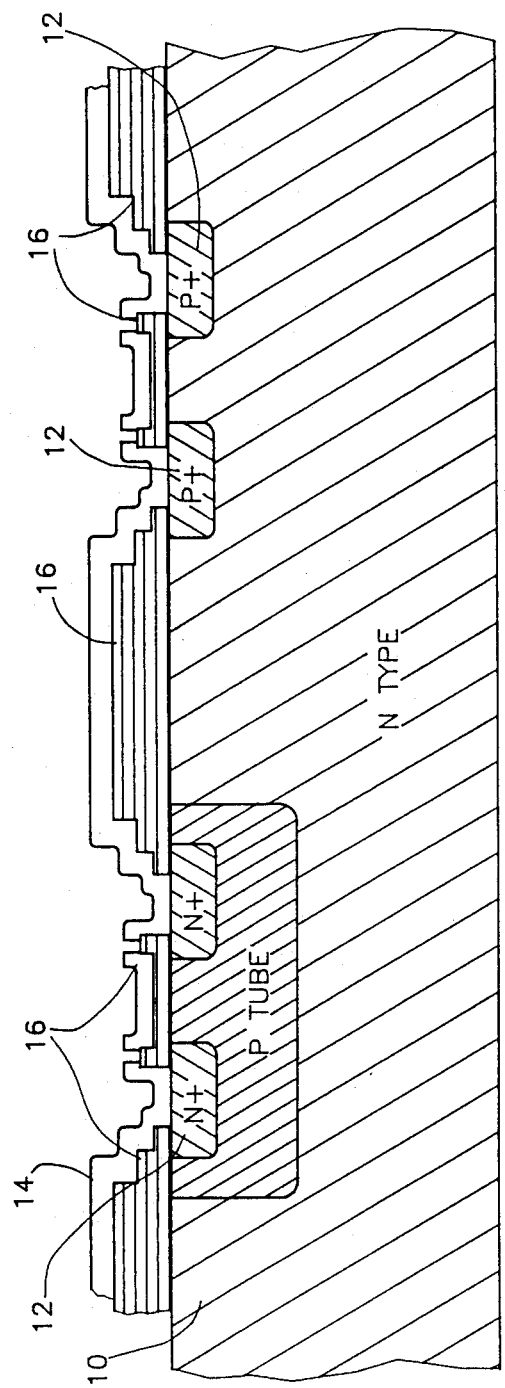

Reference is now made to FIG. 1 which illustrates a semiconductor device comprising a substrate 10, including semiconductor elements 12 formed in the substrate and a conductor layer 14 formed over the substrate and connecting various semiconductor elements 12 to each other.

The semiconductor device of FIG. 1 is arranged to be particularly suitable for laser fusing, wherein high intensity laser radiation, typically at a wavelength of 500 nanometers, is applied to the conductor layer 14 at specific locations thereof for fusing thereof, thereby selectably to define the desired conductive pattern.

A difficulty which has been identified in the prior art is that the laser energy applied to the semiconductor device may also damage or change the electrical characteristics of portions of the device such as semiconductor elements underlying the conductor which it is sought to fuse. Accordingly, the present invention provides a selectably reflective electrically insulative optical coating layer 16 which is disposed so as to underlie the regions of conductor which may be fused and thus exposed to intense laser radiation.

In accordance with a preferred embodiment of the present invention, the insulative optical coating 16 comprises the following coating:

| Layer | Material | Thickness (microns) |
|---|---|---|
| 1. | $SiO_2$ | 0.08446 |
| 2. | $Si_3N_4$ | 0.06250 |
| 3. | $SiO_2$ | 0.08446 |
| 4. | $Si_3N_4$ | 0.06250 |
| 5. | $SiO_2$ | 0.08446 |
| 6. | $Si_3N_4$ | 0.06250 |
| 7. | $SiO_2$ | 0.08446 |
| 8. | $Si_3N_4$ | 0.06250 |
| 9. | $SiO_2$ | 0.25338 | where the lowest numbered layer is closest to the substrate.

It will be appreciated that greater or lesser numbers of layers and different thicknesses of the coating layers may alternatively be employed, it being appreciated that the above-described preferred composition is presently considered to be optimal.

Figure 2:
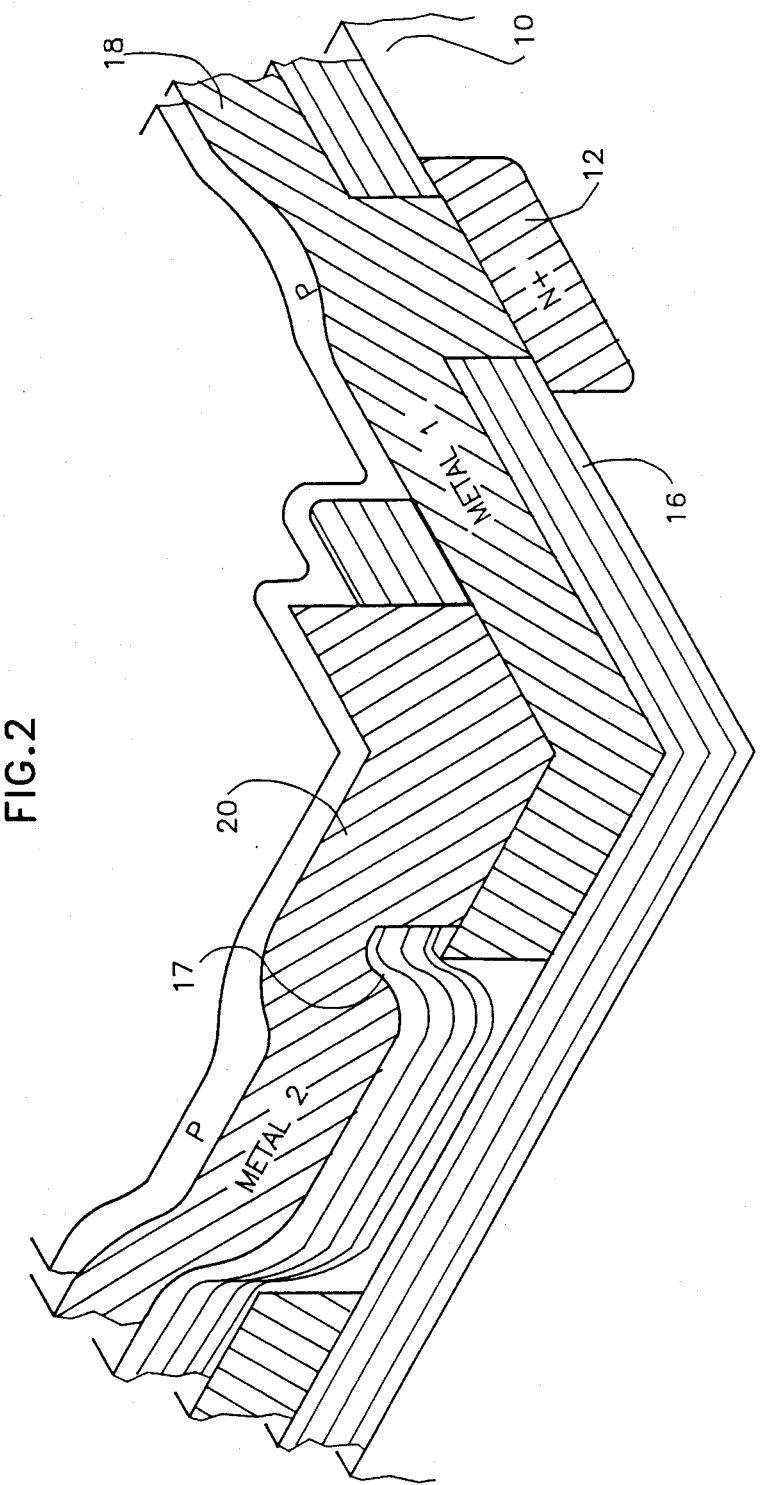

It is a particular feature of the present invention, that the coating 16 described above is etchable by conventional chemical means employed in conventional integrated circuit fabrication. This feature of being etchable is a basic requirement of an insulation layer in order to permit the required connections with the underlying layes such as via feed-through contact holes. In the embodiment of FIG. 1, it is seen that the coating 16 of the present invention is distributed generally over the substrate. According to an alternative embodiment of the invention, illustrated in FIG. 2, the coating 16 is selectively distributed over the substrate so as to cover only selected regions which may contain particularly laser radiation sensitive circuit elements. In the embodiment of FIG. 2, first and second metal layers 18 and 20 are provided, where only layer 18 overlies coating 16 and layer 20 overlies a second coating layer 17. Layer 17 is etched away at the locations where layer 18 is sought to be fused.

It will be appreciated by persons skilled in the art that the present invention is not limited by what has been particularly shown and described hereinabove. Rather the scope of the present invention is defined only by the claims which follow:

We claim:

1. A semiconductor device comprising:
 a substrate
 a fusible conductor disposed on said substrate;
 a multilayer protective optical coating disposed underlying said fusible conductor and characterized in that it is etchable and has high reflectivity and has more than two layers sufficient to prevent damage to underlying coatings from impinging laser radiation.

2. A semiconductor device according to claim 1 and wherein said optical coating is characterized by high reflectivity to electromagnetic radiation of a wavelength useful for fusing of conductors in semiconductor applications.

3. A semiconductor device according to claim 1 and wherein said multilayer protective optical coating is further characterized in that it has substantially zero phase shift characteristics for the reflected field.

4. A semiconductor device according to claim 1 and wherein said multilayer protective optical coating is further characterized in that it comprises silicon nitride.

5. A semiconductor device according to claim 1 and wherein said multilayer protective optical coating is further characterized in that it comprises alternating layers of silicon dioxide and $Si_3N_4$.

6. A semiconductor device according to claim 1 and wherein said multilayer protective optical coating comprises the following layers:

| Layer | Material |
|---|---|
| 1. | $SiO_2$ |
| 2. | $Si_3N_4$ |
| 3. | $SiO_2$ |
| 4. | $Si_3N_4$ |
| 5. | $SiO_2$ |
| 6. | $Si_3N_4$ |
| 7. | $SiO_2$ | where the lowest numbered layer is closest to the substrate.

7. A semiconductor device according to claim 1 and wherein said multilayer protective optical coating comprises the following layers:

| Layer | Material | Thickness (microns) |
|---|---|---|
| 1. | $SiO_2$ | 0.08446 |
| 2. | $Si_3N_4$ | 0.06250 |
| 3. | $SiO_2$ | 0.08446 |
| 4. | $Si_3N_4$ | 0.06250 |
| 5. | $SiO_2$ | 0.08446 |
| 6. | $Si_3N_4$ | 0.06250 |
| 7. | $SiO_2$ | 0.08446 | where the lowest numbered layer is closest to the substrate.

8. A semiconductor device according to claim 6 and wherein said multilayer protective optical coating also comprises the following layers:

| Layer | Material |
|---|---|
| 8. | $Si_3N_4$ |
| 9. | $SiO_2$ | where the lowest numbered layer is closest to the substrate.

9. A semiconductor device according to claim 7 and wherein said multilayer protective optical coating also comprises the following layers:

| Layer | Material | Thickness (microns) |
|---|---|---|
| 8. | $Si_3N_4$ | 0.06250 | where the lowest numbered layer is closest to the substrate.

10. A semiconductor device according to claim 1 and wherein said multilayer protective optical coating is applied generally over the substrate.

11. A semiconductor device according to claim 1 and wherein said multilayer coating is applied at predetermined discrete locations over the substrate.

* * * * *